(12) United States Patent
Huang et al.

(10) Patent No.: US 7,655,503 B2
(45) Date of Patent: Feb. 2, 2010

(54) METHOD FOR FABRICATING SEMICONDUCTOR PACKAGE WITH STACKED CHIPS

(75) Inventors: Jung-Pin Huang, Taichung Hsien (TW); Chin-Huang Chang, Taichung Hsien (TW); Chung-Lun Liu, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 76 days.

(21) Appl. No.: 11/649,144

(22) Filed: Jan. 2, 2007

(65) Prior Publication Data
US 2007/0108571 A1  May 17, 2007

Related U.S. Application Data

(62) Division of application No. 10/982,559, filed on Nov. 5, 2004, now Pat. No. 7,193,309.

(30) Foreign Application Priority Data
Aug. 2, 2004  (TW) .............................. 93123055 A

(51) Int. Cl.
*H01L 21/50* (2006.01)
(52) U.S. Cl. .................. 438/109; 438/123; 438/127; 257/E21.499
(58) Field of Classification Search ......... 257/666–733, 257/777, 778; 438/106–112, 121–127
See application file for complete search history.

(56) References Cited

U.S. PATENT DOCUMENTS

| | | | |
|---|---|---|---|
| 5,366,933 A | 11/1994 | Golwalkar et al. | |
| 5,527,740 A | 6/1996 | Golwalkar et al. | |
| 5,545,922 A | 8/1996 | Golwalkar et al. | |
| 6,311,527 B1 | 11/2001 | Monteiro et al. | |
| 6,603,072 B1 | 8/2003 | Foster et al. | |
| 6,690,089 B2 | 2/2004 | Uchida | |
| 6,812,556 B2 | 11/2004 | Uchida | |
| 2003/0038356 A1 | 2/2003 | Derderian | |
| 2003/0178716 A1* | 9/2003 | Maeda et al. | 257/686 |
| 2003/0189258 A1* | 10/2003 | Uchida | 257/777 |
| 2004/0018662 A1 | 1/2004 | Goto | |
| 2005/0280133 A1 | 12/2005 | Luo et al. | |

* cited by examiner

*Primary Examiner*—Marcos D. Pizarro
(74) *Attorney, Agent, or Firm*—Peter F. Corless; Steven M. Jensen; Edwards Angell Palmer & Dodge LLP

(57) ABSTRACT

A semiconductor package with stacked chips and a method for fabricating the same are proposed. The semiconductor package includes a lead frame having a plurality of leads and supporting extensions; at least one preformed package having an active surface, and a non-active surface attached to the supporting extensions of the lead frame; at least one chip mounted on the active surface of the preformed package; a plurality of bonding wires for electrically interconnecting the lead frame, the preformed package and the chip; and an encapsulant for encapsulating the preformed package, the chip, the bonding wire and a portion of the lead frame. The active surface of the preformed package serves for carrying the chip and can be used as a wire jumper, so as to solve a known good die (KGD) problem of a multi-chip module.

8 Claims, 3 Drawing Sheets

METHOD FOR FABRICATING SEMICONDUCTOR PACKAGE WITH STACKED CHIPS

CROSS-REFERENCE TO RELATED APPLICATION(S)

This application is a divisional of copending application U.S. Ser. No. 10/982,559, filed on Nov. 5, 2004.

FIELD OF THE INVENTION

The present invention relates to semiconductor packages with stacked chips and methods for fabricating the same, and more particularly, to a semiconductor package for incorporating a packaged chip and an unpackaged chip therein, and a fabrication method of the semiconductor package.

BACKGROUND OF THE INVENTION

Along with the advancement of electronic industry, electronic products have been developed with multiple functions and high performances so as to satisfy the requirements of high integration and size miniaturization for semiconductor packages. Further for improving the ability and capacity of a single semiconductor package to achieve size miniaturization, large capacity and high speed for the electronic products, the semiconductor package has been conventionally made as a multi-chip module (MCM), which is capable of effectively reducing the overall size and improving the electrical performance of the package and thus becomes a mainstream package product. The MCM package includes at least two semiconductor chips mounted and vertically stacked on a chip carrier, and is suitably applied to an integrated circuit with high electronic density. Such stacked-chip package structure has been disclosed in U.S. Pat. Nos. 5,545,922, 5,527,740 and 5,366,933.

A conventional method of stacking chips is to package two chips in a back-side to back-side manner, wherein bond pads of the two chips are arranged as a mirroring structure, such that bonding wires connected to the bond pads would not cross and entangle to each other. For example, when two chips having the same functionality are stacked together, one of the chips must be designed with bond pads having a mirroring arrangement relative to bond pads of the other chip. As a result, the fabrication cost of such stacked-chip package structure is relatively higher and increased by fabrication of different specifications for the two chips of the same functionality.

Alternatively, if two chips having the same arrangement of bond pads are stacked together, the bonding wires must be formed in a crossing manner. The crossing wires would be easily subject to short circuit, thus causing a reliability issue. This method is relatively more difficult to implement and leads to difficulty in fabrication.

Accordingly, as shown in FIG. 4, U.S. Pat. No. 6,313,527 has disclosed a semiconductor package to solve the above problems on stacking two chips. In this semiconductor package, a first chip 22 and a second chip 23 are mounted on opposite sides of a lead frame 21 respectively. The lead frame 21 comprises a die pad 21a and a plurality of leads 21b. The first chip 22 is mounted on an upper surface 21a1 of the die pad 21a, and the second chip 23 is attached to a lower surface 21a2 of the die pad 21a. A plurality of bond pads 221, 231 are respectively provided on active surfaces of the first and second chips 22, 23. The bond pads 221 of the first chip 22 are electrically connected to the leads 21b by bonding wires 24. A redistribution layer 25 is formed on the active surface of the second chip 23 and is electrically connected to the leads 21b by bonding wire 24'. Finally, an encapsulant 26 is fabricated to complete the package structure. Since the lead frame 21 is mounted with both the first and second chips 22, 23, the ability and capacity of the package are improved. Moreover, the redistribution layer 25 serves as a wire jumper, such that neither crossing wires nor fabrication of different specifications for chips are required, and the foregoing problems can be solved.

However, the above semiconductor package requires the extra redistribution layer 25. The redistribution layer 25 serving as the wire jumper is a circuit layer with a specific design, which is not commonly available and thus increases the overall design and fabrication costs of the package.

Referring to FIG. 5, another stacked-chip semiconductor package has been disclosed without the use of crossing wires. In this semiconductor package, a first chip 31 and a second chip 32 are mounted on opposite sides of a lead frame 30 respectively. The lead frame 30 comprises a die pad 30a and a plurality of leads 30b. The first chip 31 is attached to a lower surface 30a1 of the die pad 30a. A substrate 33 is mounted on an upper surface 30a2 of the die pad 30a, and the second chip 32 is mounted on the substrate 33. A plurality of bond pads 311, 321 are respectively provided on active surfaces of the first and second chips 31, 32. The bond pads 311 of the first chip 31 are electrically connected to the leads 30b by bonding wires 34. The bond pads 321 of the second chip 32 are firstly electrically connected to bond pads 331 formed on the substrate 33 by bonding wires 35, and then the bond pads 331 of the substrate 33 are electrically connected to the leads 30b by bonding wires 34. Finally, an encapsulant 36 is fabricated to complete the package structure. Similarly, since the lead frame 30 is mounted with both the first and second chips 31, 32, the ability and capacity of the package are improved. Moreover, the bond pads 331 of the substrate 33 serve as a wire jumper, such that the electrical connection of the second chip 32 can be established without using a redistribution method, thereby eliminating the foregoing drawback of the semiconductor package shown in FIG. 4.

However, the above package structure in FIG. 5 requires the extra substrate 33 serving as the wire jumper for the second chip 32, and thus increases the overall fabrication and assembly costs thereof.

Furthermore, in the above package structure, the substrate 33 serving as the wire jumper is firstly attached to the upper surface 30a2 of the die pad 30a of the lead frame 30, and then the second chip 32 is mounted on the substrate 33. The thickness of the substrate 33 is usually larger than that of the chip, which would affect the overall thickness of the package structure. The second chip 32 and the substrate 33 are made of different materials, thereby causing mismatch in coefficient of thermal expansion (CTE) between the second chip 32 and the substrate 33. This results in a significant difference in thermal deformation of expansion and contraction between the second chip 32 and the substrate 33, such that delamination or warpage would easily occur.

Moreover, the lower surface 30a1 of the die pad 30a of the lead frame 30 is mounted with the first chip 31, and the upper surface 30a2 of the die pad 30a is mounted with the substrate 33 and the second chip 32 thereon, such that the upper surface 30a2 of the die pad 30a carriers one more component than the lower surface 30a1 thereof, which forms an unsymmetrical structure. During an encapsulating process, such unsymmetrical structure would cause different upper and lower flow speeds of a resin for making the encapsulant 36 and uneven distribution of the resin. Since the resin is usually a viscous fluid having a low Reynolds number, voids may be generated by incomplete filling of the resin due to the different flow speeds and uneven distribution. And air trapped in the voids may expand and lead to a popcorn effect during a subsequent high-temperature reliability test. This not only damages the package structure but also degrades the yield thereof.

As the first chip 31 and the second chip 32 before being mounted on the die pad 30a of the lead frame 30 have not been tested, and the untested chips 31, 32 are directly subjected to encapsulation, a known good die (KGD) problem may thus be encountered. In other words, even if perfect encapsulation has been performed, the yield of the fabricated packages would still be degraded in the case that the untested first and second chips 31, 32 have defects without the quality thereof being confirmed.

Accordingly, the current various multi-chip packages with the conventional design of the stacked chips would be difficult to eliminate all the above prior-art drawbacks. Therefore, the problem to be solved here is to provide a semiconductor package with stacked chips and a method for fabricating the same so as to reduce a packaging area and improve electrical performance as well as prevent mismatch in CTE and uneven resin flows.

SUMMARY OF THE INVENTION

In light of the above prior-art drawbacks, a primary objective of the present invention is to provide a semiconductor package having a multi-chip module and a method for fabricating the same.

Another objective of the present invention is to provide a semiconductor package incorporated with both packaged and unpackaged chips, and a method for fabricating the same.

Still another objective of the present invention is to provide a semiconductor package with stacked chips and a method for fabricating the same, which can partly solve a known good die (KGD) problem to improve the yield of the semiconductor package.

A further objective of the present invention is to provide a semiconductor package with stacked chips and a method for fabricating the same, which can prevent structural warpage and delamination caused by mismatch in coefficient of thermal expansion (CTE).

A further objective of the present invention is to provide a semiconductor package with stacked chips and a method for fabricating the same, which can provide a wire-jumper function without using a redistribution layer.

A further objective of the present invention is to provide a semiconductor package with stacked chips and a method for fabricating the same, by which the thicknesses of chips mounted in the semiconductor package are balanced to prevent uneven resin flows of an encapsulant and reduce the flow resistance of the encapsulant to diminish the formation of voids.

In accordance with the foregoing and other objectives, the present invention proposes a semiconductor package with stacked chips. This semiconductor package comprises a lead frame having a plurality of leads and supporting extensions; a preformed package having an active surface, and a non-active surface attached to the supporting extensions of the lead frame; at least one chip mounted on the active surface of the preformed package; a plurality of bonding wires for electrically interconnecting the lead frame, the preformed package and the chip; and an encapsulant formed on the lead frame, for encapsulating the preformed package, the chip, the bonding wire and a portion of the lead frame.

The present invention also proposes a method for fabricating the foregoing semiconductor package with stacked chips. The method comprises the steps of: preparing a lead frame having a plurality of leads and supporting extensions; preparing at least one preformed package having an active surface and a non-active surface, and attaching the non-active surface of the preformed package to the supporting extensions of the lead frame; subsequently, mounting at least one chip on the active surface of the preformed package; forming a plurality of bonding wires to electrically interconnect the lead frame, the preformed package and the chip; and finally, forming an encapsulant to encapsulate the preformed package, the chip, the bonding wire and a portion of the lead frame.

In the present invention, during a prefabrication process, a chip is packaged to form a preformed package; then, the preformed package is mounted on the supporting extensions of the lead frame. Compared to a chip mounted on a single substrate, the preformed package has been packaged and thus its structure is more reinforced, such that the semiconductor package incorporated with this preformed package is not easily subject to thermally induced warpage. Further, since the active surface of the preformed package serves for carrying another chip and is similar to a carrier, this active surface can be used as a wire jumper.

Moreover, as the preformed package has been fabricated and tested, any inferior preformed package can be discarded before being incorporated in the semiconductor package, thereby improving the yield of the semiconductor package. Additionally, the preformed package is mounted on the down-set supporting extensions of the lead frame, such that the thicknesses of the chips stacked on and in the preformed packaged can be balanced to prevent uneven resin flows of the encapsulant. This thus reduces the flow resistance of the encapsulant to diminish the formation of voids and further improves the yield of the semiconductor package.

Furthermore, the semiconductor package in the present invention allows at least one chip to be stacked on the preformed package, which provides a structure for stacking multiple chips and incorporates both packaged and unpackaged chips, such that the performance and capacity of the semiconductor package are improved.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a semiconductor package with stacked chips and a method for fabricating the same proposed in the present invention are described in detail with reference to FIGS. 1 to 3.

In the present invention, a preformed package is mounted on a lead frame and supported by a plurality of supporting extensions of the lead frame. An unpackaged chip is attached to an active surface of the preformed package, such that the active surface of the preformed package serves as a carrier for stacking the chip and can be used as a wire jumper.

First Preferred Embodiment

Figure 1:
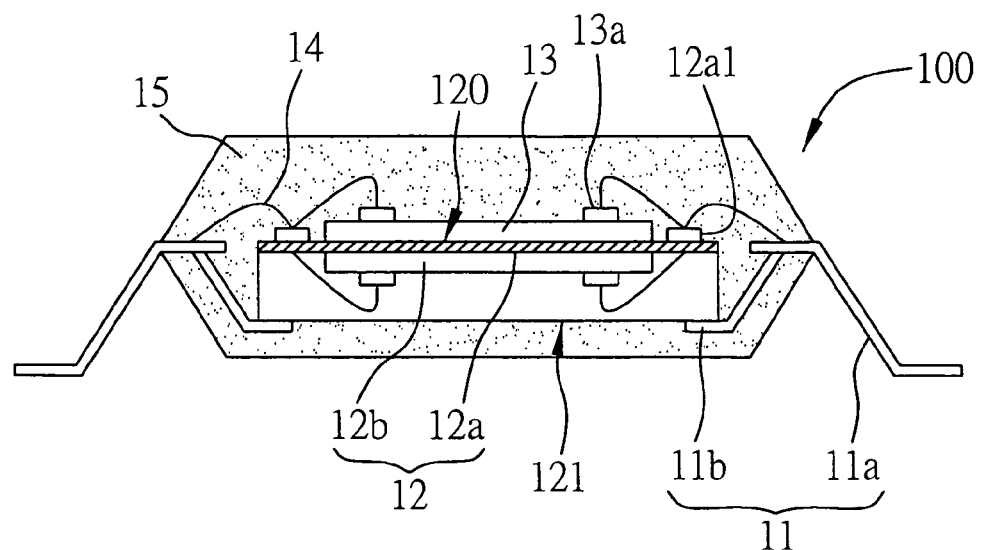
FIG. 1 is a cross-sectional view of a semiconductor package with stacked chips and a method for fabricating the same according to the present invention.
Figure 2:
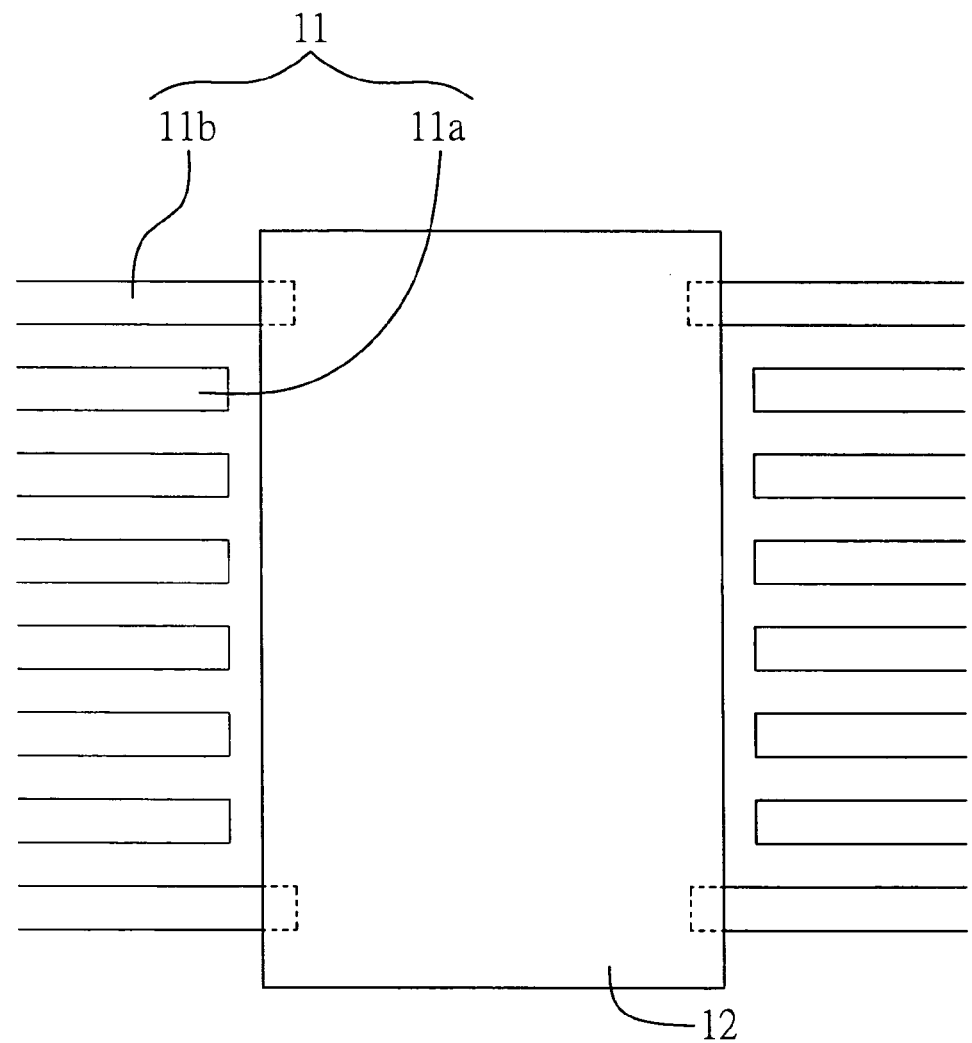
FIG. 2 is a top view of a preformed package being mounted on a lead frame in the semiconductor package and the method for fabricating the same according to the present invention.

Referring to FIGS. 1 and 2, the semiconductor package 100 with stacked chips according to the present invention comprises a lead frame 11 having a plurality of leads 11a and supporting extensions 11b; at least one preformed package 12 mounted on the supporting extensions 11b of the lead frame 11 and supported by the supporting extensions 11b in a downset manner, wherein the preformed package 12 has an active surface 120 and a non-active surface 121, and the non-active surface 121 is attached to the supporting extensions 11b of the lead frame 11; at least one chip 13 mounted on the active surface 120 of the preformed package 12; a plurality of bonding wires 14 for electrically interconnecting the lead frame 11, the preformed package 12 and the chip 13; and an encapsulant 15 formed on the lead frame 11, for encapsulating the preformed package 12, the chip 13, the bonding wire 14 and a portion of the lead frame 11.

The foregoing semiconductor package 100 can be fabricated by a method comprising the steps of: preparing a lead frame 11; preparing at least one preformed package 12 having an active surface 120 and a non-active surface 121, and attaching the non-active surface 121 of the preformed package 12 to a plurality of supporting extensions 11b of the lead frame 11; subsequently, mounting at least one chip 13 on the active surface 120 of the preformed package 12; forming a plurality of bonding wires 14 to electrically interconnect the lead frame 11, the preformed package 12 and the chip 13; and finally, forming an encapsulant 15 to encapsulate the preformed package 12, the chip 13, the bonding wire 14 and a portion of the lead frame 11.

The preformed package 12 comprises at least one chip 12b mounted on and electrically connected to a surface of a substrate 12a, and subjected to being tested and packaged. The substrate 12a can be a printed circuit board such as a build-up substrate or laminated substrate. The preformed package 12 can be an output structure of a land grid array (LGA) package.

A surface of the foregoing substrate 12a not being mounted with the chip 12b serves as the active surface 120 of the preformed package 12 for carrying the chip 13. A plurality of fingers 12a1 are provided around the chip 13 on the substrate 12a, and a plurality of bond pads 13a are formed on a surface of the chip 13 not being attached to the active surface 120 of the preformed package 12. The fingers 12a1 serve as a wire jumper, such that the chip 13 is electrically connected to the preformed package 12 by the bonding wire 14 and further electrically connected to the leads 11a of the lead frame 11 via the fingers 12a1 and the bonding wires 14. Therefore, the substrate 12a of the preformed package 12 provides a wire-jumper function without using the conventional crossing wires or altering the chip design, so as to simplify the fabrication processes and reduce the fabrication cost.

Referring to FIG. 2, since the foregoing preformed package 12 has been completely packaged, compared to the single substrate in the prior art, the preformed package 12 has a more reinforced structure such that the semiconductor package incorporated with the preformed package 12 is not easily subject to thermally induced warpage and delamination caused by mismatch in CTE.

Second Preferred Embodiment

Figure 3A:
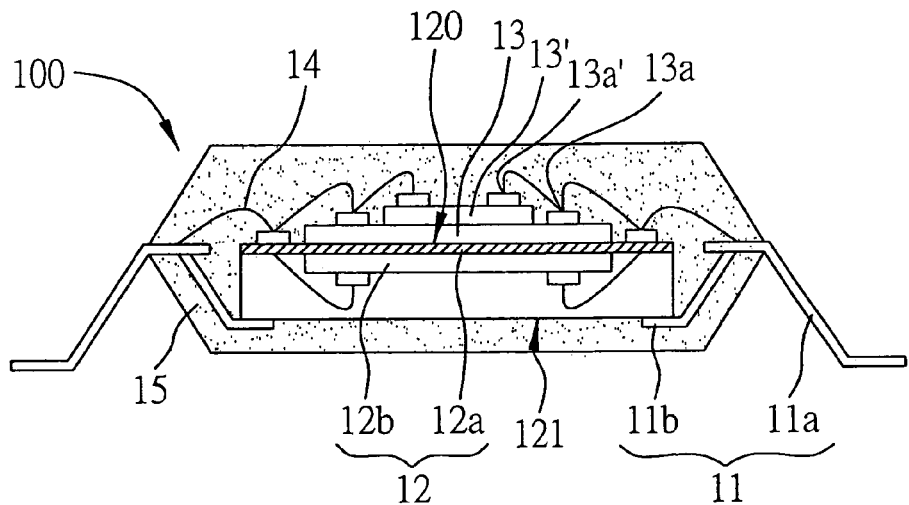
FIG. 3A is a cross-sectional view showing chips being vertically stacked on the preformed package in the semiconductor package and the method for fabricating the same according to the present invention.

Referring to FIG. 3A, this second embodiment differs from the foregoing first embodiment in that there is another chip 13' vertically stacked on the unpackaged chip 13. In other words, two chips 13, 13' are stacked on the active surface 120 of the preformed package 12, and the thickness of the underlying preformed package 12 is approximately or completely equal to the combined thickness of the overlying chips 13, 13'. This forms a symmetric structure to thereby avoid uneven resin flows or voids during an encapsulating process for fabricating the encapsulant 15 such that a popcorn effect caused by the voids can be prevented during a subsequent high-temperature reliability test and the yield of the semiconductor package 100 is improved.

Apart from stacking two chips 13, 13' on the active surface 120 of the preformed package 12, if the preformed package has a larger thickness and under a condition to satisfy a functional requirement of the semiconductor package, a third chip can be further vertically stacked on the two chips. That is, the present invention is not limited to the arrangement of stacking two chips 13, 13' as shown in FIG. 3A. This also provides a symmetric structure to balance the resin flows and prevent the voids or popcorn effect.

Third Preferred Embodiment

Figure 3B:
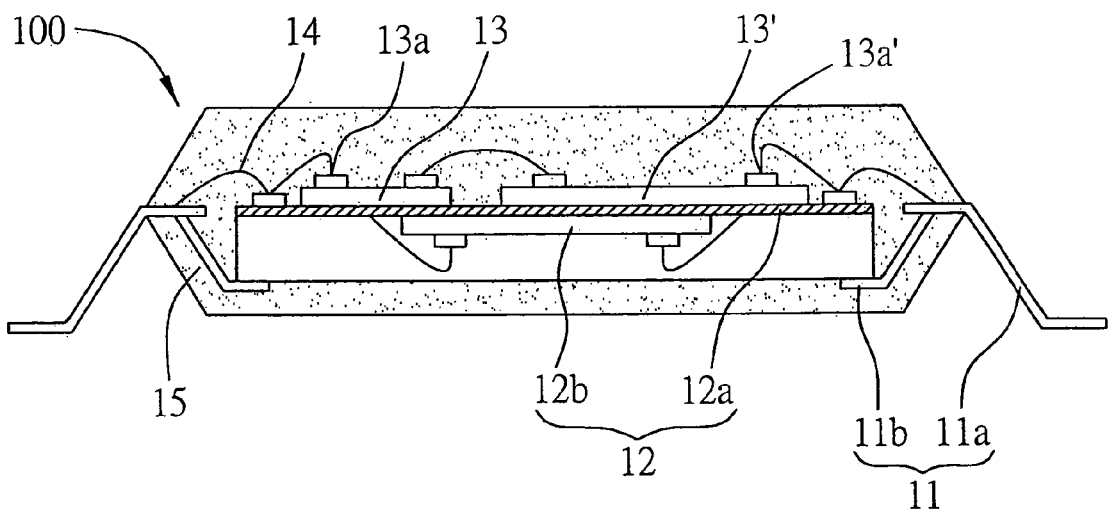
FIG. 3B is a cross-sectional view showing chips being horizontally mounted on the preformed package in the semiconductor package and the method for fabricating the same according to the present invention.
Figure 4:
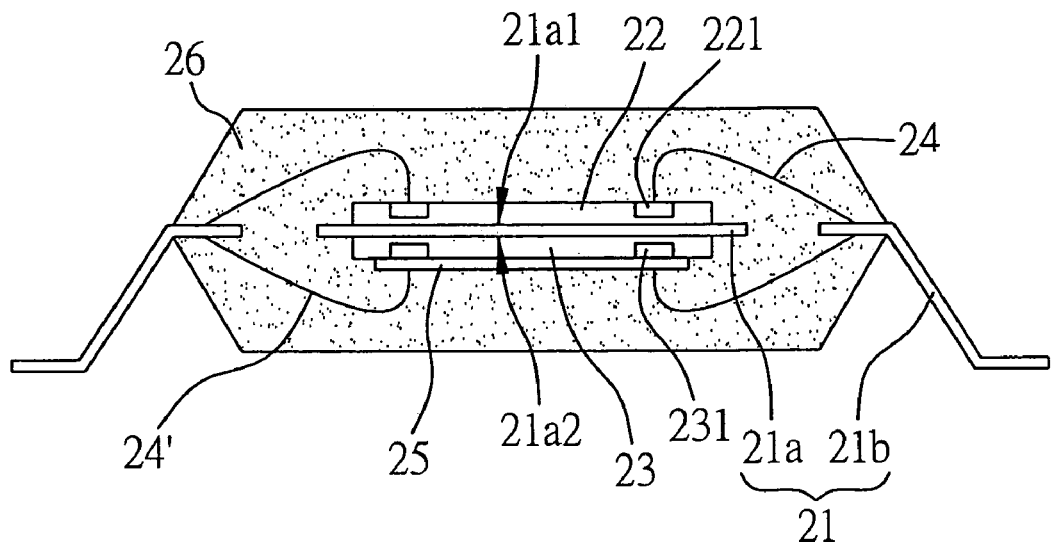
FIG. 4 (PRIOR ART) is a cross-sectional view of a semiconductor package disclosed in U.S. Pat. No. 6,313,527.
Figure 5:
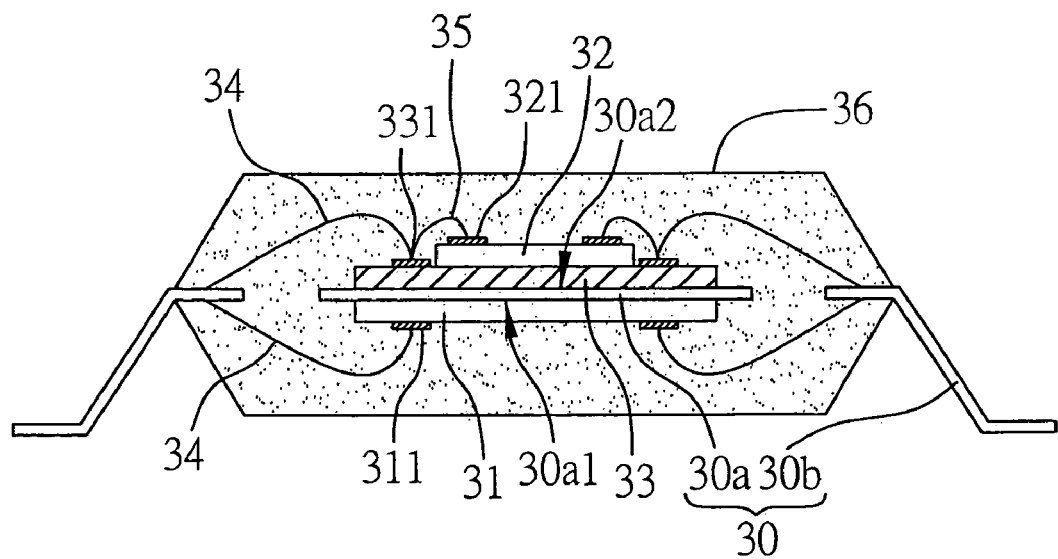
FIG. 5 (PRIOR ART) is cross-sectional view of a conventional semiconductor package.

Referring to FIG. 3B, this third embodiment differs from the foregoing first embodiment in that there are at least two unpackaged chips 13, 13' horizontally mounted on the active surface 120 of the preformed package 12 according to a functional requirement for the semiconductor package 100. Further, more chips can be vertically stacked on the horizontally mounted chips. That is, the present invention allows a horizontally mounting arrangement of chips and also a vertically stacking arrangement of chips in the semiconductor package.

Moreover, the number of chips packaged in the preformed package 12 is not limited to one but can also be two or more depending on a practical requirement. In case two or more chips are packaged in the preformed package 12, they can be horizontally mounted or vertically stacked in the preformed package 12.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a semiconductor package with stacked chips, comprising the steps of:

preparing a lead frame having a plurality of leads and supporting extensions;

preparing at least one preformed package having an active surface and a non-active surface, including the steps of:

mounting at least a first chip on a substrate, electrically connecting the first chip to the substrate, and packaging the first chip and the substrate to form the preformed package;

attaching the non-active surface of the preformed package to the plurality of supporting extensions of the lead frame;

mounting at least a second chip on the active surface of the preformed package, wherein the active surface of the preformed package is a surface of the substrate free of being mounted with the first chip;

electrically interconnecting the lead frame, the preformed package and the second chip via a plurality of bonding wires; and forming an encapsulant for encapsulating the preformed package, the second chip, the bonding wires and a portion of the lead frame.

2. The method of claim 1, wherein a surface of the chip free of being attached to the active surface of the preformed package is formed with a plurality of bond pads.

3. The method of claim 1, wherein the first chip is mounted on a surface of the substrate opposite to the active surface.

4. The method of claim 3, wherein the preformed package is a land grid array (LGA) package.

5. The method of claim 3, wherein the substrate comprises a plurality of fingers.

6. The method of claim 1, wherein the substrate is a printed circuit board.

7. The method of claim 6, wherein the printed circuit board is a build-up substrate.

8. The method of claim 6, wherein the printed circuit board is a laminated substrate.

* * * * *